US007842573B2

(12) United States Patent
Swift et al.

(10) Patent No.: US 7,842,573 B2
(45) Date of Patent: Nov. 30, 2010

(54) VIRTUAL GROUND MEMORY ARRAY AND METHOD THEREFOR

(75) Inventors: Craig T. Swift, Austin, TX (US); Gowrishankar L. G. Chindalore, Austin, TX (US); Laureen H. Parker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 12/397,905

(22) Filed: Mar. 4, 2009

(65) Prior Publication Data

US 2009/0170262 A1 Jul. 2, 2009

Related U.S. Application Data

(62) Division of application No. 10/961,295, filed on Oct. 8, 2004, now Pat. No. 7,518,179.

(51) Int. Cl.
*H01L 21/336* (2006.01)

(52) U.S. Cl. ............... 438/266; 438/364; 257/E21.444; 257/E21.662

(58) Field of Classification Search ....................... None
See application file for complete search history.

(56) References Cited

U.S. PATENT DOCUMENTS

| | | | |
|---|---|---|---|
| 5,087,584 | A | 2/1992 | Wada et al. |
| 5,966,603 | A | 10/1999 | Eitan |
| 6,191,445 | B1 | 2/2001 | Fujiwara |
| 6,297,096 | B1 | 10/2001 | Boaz |
| 6,352,895 | B1 | 3/2002 | Lam |
| 6,373,096 | B1 | 4/2002 | Hisamune et al. |
| 6,391,722 | B1 | 5/2002 | Koh |
| 6,391,733 | B1 | 5/2002 | Fisher |
| 6,509,222 | B1 | 1/2003 | Grossi et al. |
| 6,687,156 | B2 | 2/2004 | Kobayashi et al. |
| 6,706,599 | B1 | 3/2004 | Sadd et al. |
| 6,727,144 | B2 | 4/2004 | Hashimoto |
| 6,787,418 | B2 | 9/2004 | Chu et al. |
| 7,064,030 | B2 | 6/2006 | Chindalore et al. |

(Continued)

OTHER PUBLICATIONS

Restriction Requirement mailed May 5, 2006 in U.S. Appl. No. 10/961,295.

(Continued)

*Primary Examiner*—Jarrett J Stark
(74) *Attorney, Agent, or Firm*—James L. Clingan, Jr.; Daniel D. Hill

(57) ABSTRACT

A virtual ground memory array (VGA) is formed by a storage layer over a substrate with a conductive layer over the storage layer. The conductive layer is opened according to a patterned photoresist layer. The openings are implanted to form source/drain lines in the substrate, then filled with a layer of dielectric material. Chemical mechanical polishing (CMP) is then performed until the top of the conductive layer is exposed. This leaves dielectric spacers over the source/drain lines and conductive material between the dielectric spacers. Word lines are then formed over the conductive material and the dielectric spacers. As an alternative, instead of using a conductive layer, a sacrificial layer is used that is removed after the CMP step. After removing the sacrificial portions, the word lines are formed. In both cases, dielectric spacers reduce gate/drain capacitance and the distance from substrate to gate is held constant across the channel.

13 Claims, 4 Drawing Sheets

10
28
14
16
18
22
24
26
12

U.S. PATENT DOCUMENTS

2003/0080372 A1 5/2003 Mikolajick
2004/0095797 A1 5/2004 Yuan et al.
2006/0076604 A1 4/2006 Prinz et al.

OTHER PUBLICATIONS

Office Action mailed Jun. 20, 2006 in U.S. Appl. No. 10/961,295.
Office Action mailed Oct. 30, 2006 in U.S. Appl. No. 10/961,295.
Examiner's Interview Summary mailed Jan. 19, 2007 in U.S. Appl. No. 10/961,295.
Pre-Appeal Brief Conference Decision mailed Mar. 29, 2007 in U.S. Appl. No. 10/961,295.
Examiner's Decision on Appeal mailed Oct. 22, 2007 in U.S. Appl. No. 10/961,295.
BPAI Decision mailed Sep. 17, 2008 in U.S. Appl. No. 10/961,295.
Notice of Allowance mailed Dec. 15, 2008 in U.S. Appl. No. 10/961,295.
Office Action mailed Apr. 25, 2006 in U.S. Appl. No. 10/961,296.
Office Action mailed Oct. 31, 2006 in U.S. Appl. No. 10/961,296.
Office Action mailed Apr. 4, 2007 in U.S. Appl. No. 10/961,296.
Examiner's Interview Summary mailed May 25, 2007 in U.S. Appl. No. 10/961,296.
Examiner's Interview Summary mailed Jul. 27, 2005 in U.S. Appl. No. 10/961,014.
Notice of Allowance mailed Jul. 27, 2005 in U.S. Appl. No. 10/961,014.

VIRTUAL GROUND MEMORY ARRAY AND METHOD THEREFOR

RELATED APPLICATIONS

This application is related to US patent application docket number SC13594TP, titled "A Virtual Ground Memory Array and Method Therefor" filed concurrently herewith and assigned to the assignee hereof.

This application is related to US patent application docket number SC13597TP titled, "Method For Forming a Multi-Bit Non-Volatile Memory Device" filed concurrently herewith and assigned to the assignee hereof.

1. Field of the Invention

The present invention relates to virtual ground memory arrays (VGAs), and more particularly, to VGAs with enhanced separation between source/drain and word line.

2. Related Art

Virtual ground memory arrays (VGAs) are particularly useful because they are very high density with their preferred usage being in non-volatile memories. VGAs do not require field isolation but require control of both the source and drain of the memory transistors that serve as memory elements. The VGA type memory is widely applicable to the various types of non-volatile memories, such as ROMs, PROMs, OTPROMs, flash, EPROMs, and EEPROMs. The VGA is also applicable to different storage mediums such as floating gate and nitride. One of the characteristics of some VGAs is that the word line, which functions as the gate of the transistors for a given row of memory transistors, passes over the sources and drains. Although this is useful in achieving the high density of memory elements of VGAs, this also increases the capacitance between the word line (gate) and the drain. This is also sometimes called the Miller capacitance. The gate/drain capacitance, however, is preferably low.

One of the techniques in the past to reduce the gate/drain capacitance has been to grow an oxide layer over the sources and drains to provide increased separation between the gate and drain, thereby reducing gate/drain capacitance. While this is an effective approach for reducing the capacitance, it also introduces additional difficulties. The oxide growth has the effect of lowering the source/drains below the top surface of the silicon because the oxidation process involves using the substrate silicon in forming the oxide. This in turn causes what is known as a bird's beak similar to that found in LOCOS type isolation. The bird's beak has the effect of increasing the gate dielectric thickness at the edge of the gate where the sources and drains are. This is difficult to control and alters the operation of the memory transistor. Another problem with the oxide growth approach is that the temperature and time for performing this growth causes additional diffusion of the source/drain regions. Also this bird's beak has not changed much as the processing and lithography technology has improved to make transistors smaller. Thus the deleterious effect of the bird's beak actually gets more significant as the technology has improved and the transistors get smaller.

Thus, there is a need for a method and structure that reduces alleviates these problems while reducing the gate to drain capacitance of memory transistors in a VGA.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a virtual ground memory array (VGA) is formed by forming a storage layer over a semiconductor substrate then forming a conductive layer over the storage layer. The conductive layer is opened according to a pattern of a patterned photoresist layer. The openings are implanted to form the source/drain lines in the substrate, then filled with a conformal layer of dielectric material. A chemical mechanical polishing (CMP) step is then performed until the top of the conductive layer is exposed. This leaves dielectric spacers over the source/drain lines and conductive material between the dielectric spacers. Word lines are then formed over the conductive material and the dielectric spacers. As an alternative, instead of using a conductive layer, a sacrificial layer is used that is removed after the CMP step. After removing the sacrificial portions, the word lines are formed. In both cases, dielectric spacers reduce gate/drain capacitance and the distance from substrate to gate is held constant across the channel. This is better understood with reference to the drawings and the following description.

Figure 1:
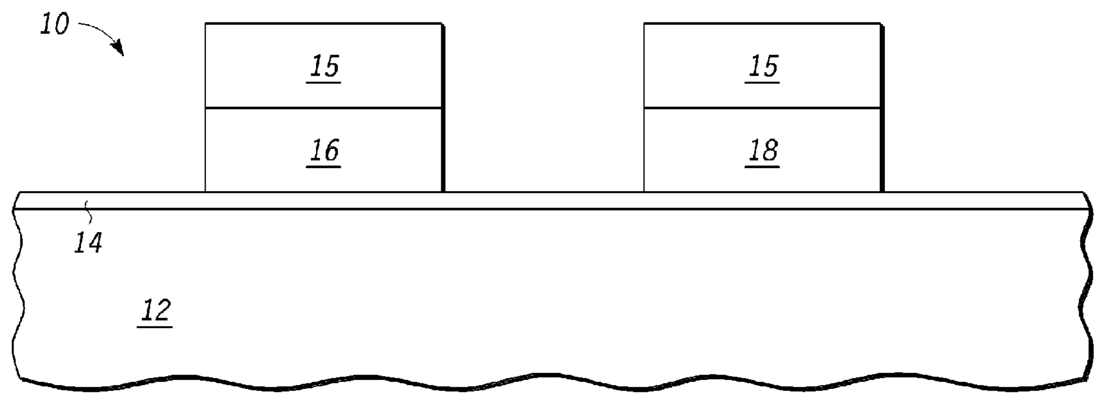
FIG. 1 is a cross section of a VGA according to a first embodiment of the invention at a stage in processing.

Shown in FIG. 1 is a semiconductor device that is a portion of a virtual ground memory array (VGA) 10 comprising a substrate 12, a charge storage layer 14 over substrate 12, patterned conductive portions 16 and 18 over storage layer 14, and a patterned photoresist layer 15 over conductive portions 16 and 18. Substrate 12 is preferably a bulk silicon substrate but could be an SOI substrate also and could be a different semiconductor material than silicon. The portion of substrate 12 shown in FIG. 1 is doped as a well; preferably a P well. Storage layer 14 is preferably comprised of a gate dielectric layer, a layer of nanocrystals over the gate dielectric, and an oxide layer over the nanocrystals. The gate dielectric layer is preferably a grown oxide that is 50 to 100 Angstroms. Storage layer 14 could also be a nitride layer over the gate dielectric layer with an oxide layer over the nitride layer. Conductive portions 16 are preferably polysilicon but could be a different material and are preferably between 1000 and 2000 Angstroms in thickness. A memory using VGAs typically is made of many subarrays. Conductive portions 16 and 18 run the length of the particular subarray of which they are a part. In the preferred case of conductive portions 16 and 18 being polysilicon, they may not be doped at this point in processing so they may not actually be conductive at this point but can be considered conductive portions because they will become conductive when they are doped in subsequent processing.

Figure 2:
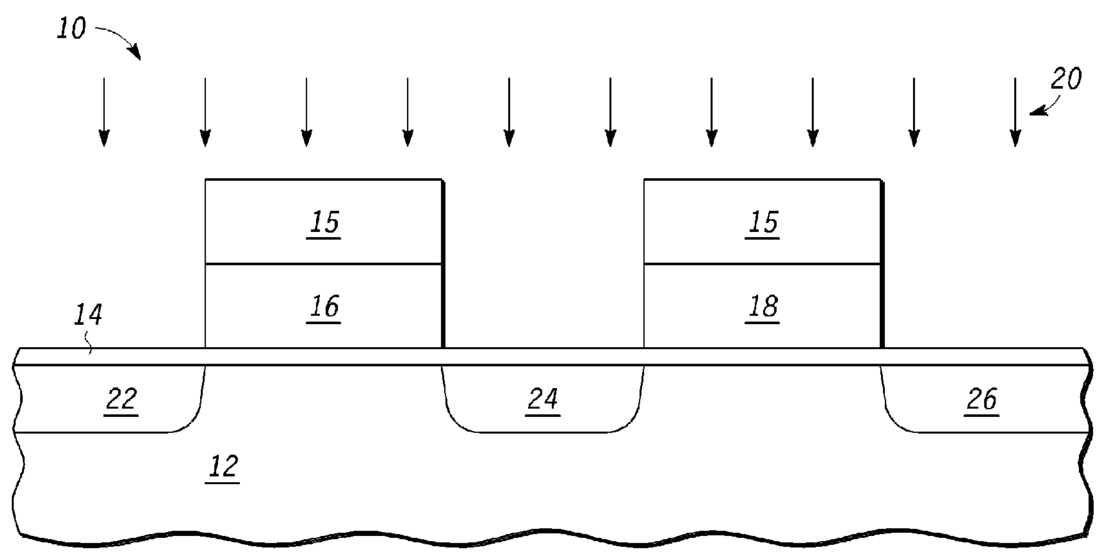
FIG. 2 is a cross section of the VGA of FIG. 1 at a subsequent stage in processing.

Shown in FIG. 2 is VGA 10 after performing an implanting step 20 to form source/drain regions 22, 24, and 26 in substrate 12 using patterned photoresist 15 and conductive portions 16 and 18 as a mask. Source/drain regions 22, 24, and 26 are doped regions preferably doped to N type to form N channel transistors. N channel transistors are preferred over P channel transistors because of their higher mobility. Alternatively, substrate 12 could be doped to form an N well and P channel transistors could be formed by doping source/drain regions 22, 24, and 26 to P type. The implant dopant is preferably arsenic to limit the lateral diffusion but could be phosphorus or a combination of dopants. Source/drain regions 22, 24, and 26 function as bit line regions for VGA 10. An option is to remove storage layer 14 in the area over source/drain regions 22, 24, and 26. This would allow for storage layer 14 to use a floating gate as the charge storage element. If this option is chosen, it is preferable that it is done after the implanting.

Figure 3:
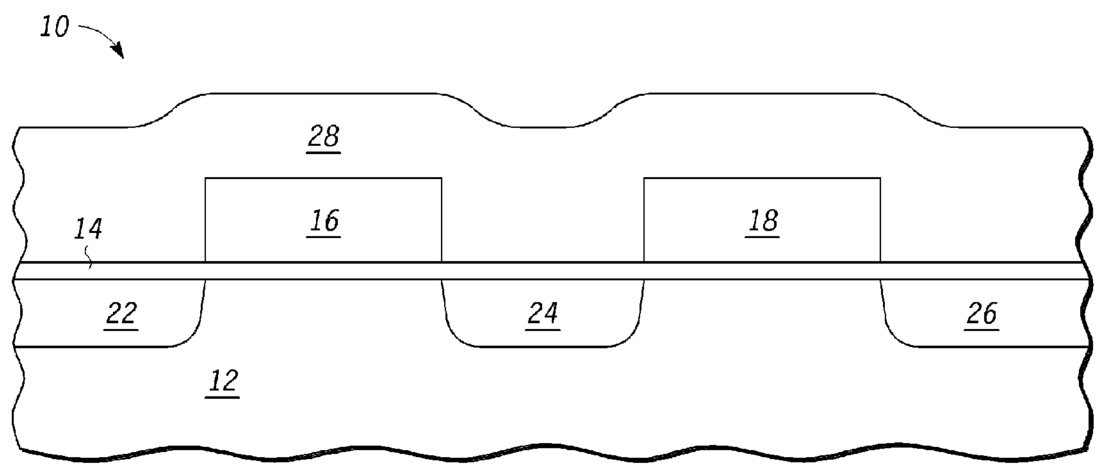
FIG. 3 is a cross section of the VGA of FIG. 2 at a subsequent stage in processing.

Shown in FIG. 3 is VGA 10 after removal of photoresist layer 15 and deposition of a somewhat conformal dielectric layer 28 that is sufficiently thick, preferably 1000 to 2000 Angstroms, that it rises to at least near the height of conductive portions 16 and 18. Dielectric layer 28 is preferably oxide, and more particularly oxide from TEOS, but could be a different material. Dielectric layer 28 preferably has a low dielectric constant. Thus, there would be benefit to having a lower k material than oxide if other processing restraints can be met.

Figure 4:
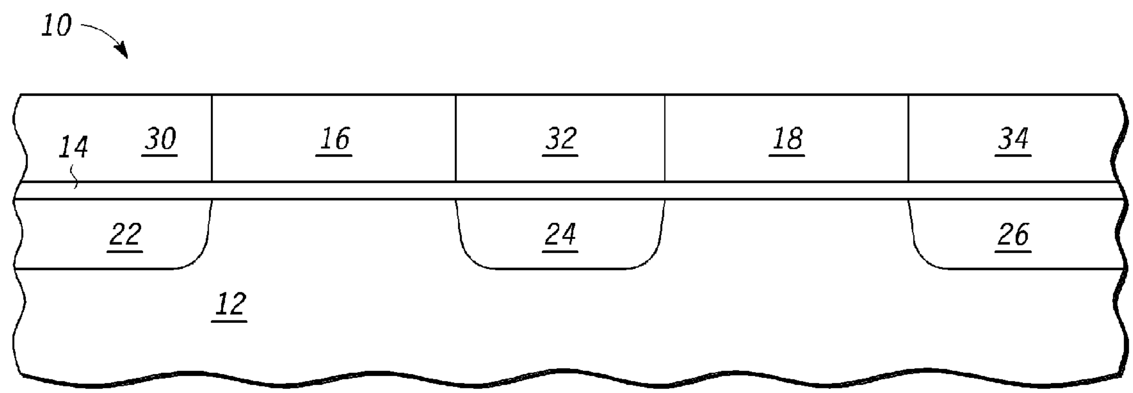
FIG. 4 is a cross section of the VGA of FIG. 3 at a subsequent stage in processing.

Shown in FIG. 4 is VGA 10 after a chemical mechanical polishing (CMP) step that is performed until conductive portions 16 and 18 are exposed. The result is a relatively flat surface in which dielectric layer 28 has been polished back to leave dielectric regions 30, 32, and 34 over source/drain regions 22, 24, and 26, respectively. The CMP step will reduce the thickness of conductive portions 16 and 18 somewhat to ensure they are exposed in all locations of VGA 10. Conductive portions 16 and 18 can be viewed as a polish stop because when the amount of oxide being removed becomes constant, then it is known that no more polishing is necessary.

Figure 5:
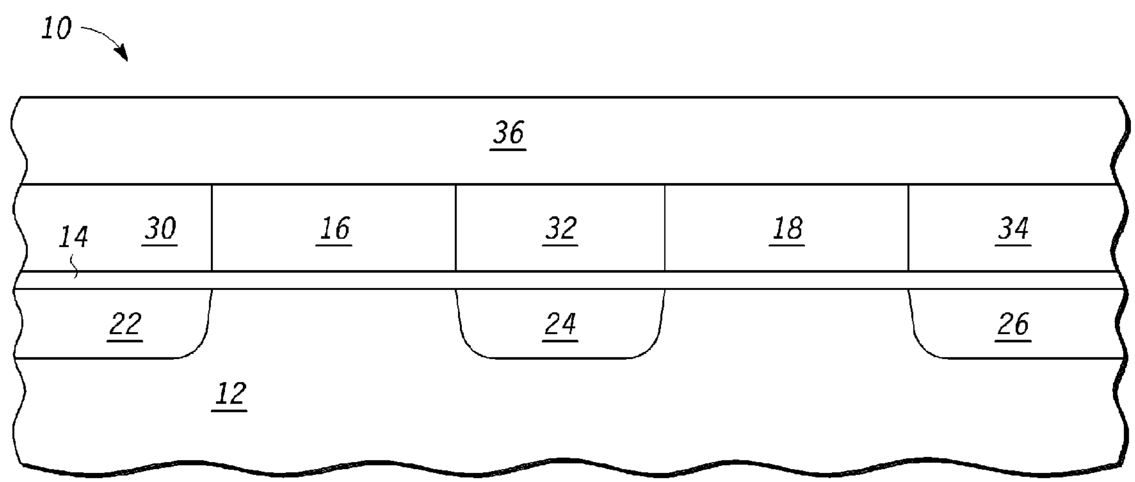
FIG. 5 is a cross section of the VGA of FIG. 4 at a subsequent stage in processing.

Shown in FIG. 5 is VGA 10 after formation of a word line 36 of preferably polysilicon although another conductive material could be used. Word line 36 runs the width of the subarray of which it is a part. During an etch in the formation of word line 36, an etch of conductive portions 16 and 18 that is not under word line 36 is also etched. Conductive portion 16 functions as a gate for a memory transistor that has source/drains regions 22 and 24 as its source and drain. Conductive portion 18 functions as a gate for a memory transistor that has source/drain regions 24 and 26 as their source and drain. Word line 36 contacts conductive portions 16 and 18 as its function as a word line. Word line 36 runs perpendicular to source/drain regions 22, 24, and 26 in their function as bit lines.

Thus, there is an effective reduction in the gate to drain capacitance of the memory transistors due to the dielectric spacers, which are effectively dielectric regions 30, 32, and 34, and while achieving gate to channel uniformity. The dielectric spacers, which can also be considered insulating layers, are substantially rectangular in cross section and they have substantially planar sidewalls and bottom surfaces. This can also be viewed as the dielectric spacers having a bottom surface that is substantially coplanar with the top surface of the storage layer over the channel region. This method and structure should also be able to be used with similar effect as lithography and processing improvements reduce the geometries, such as channel lengths. Further, this is achieved while not requiring any extra masks than normally required for a VGA.

Figure 6:
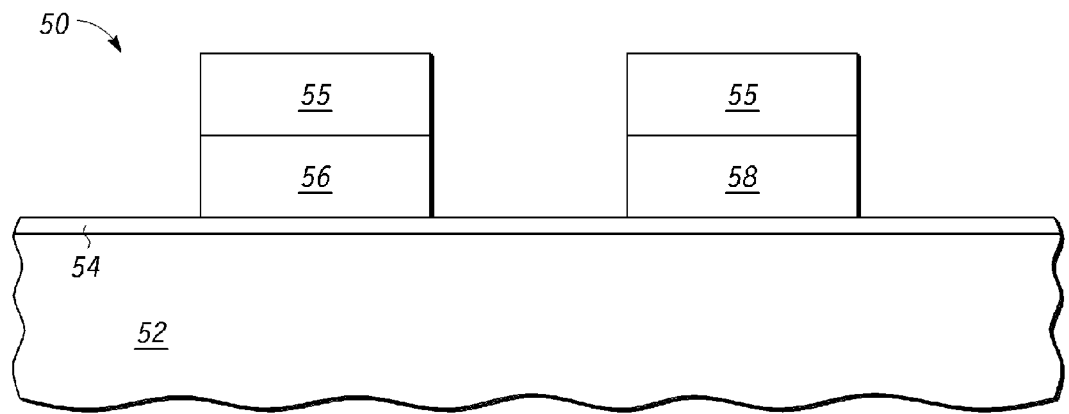
FIG. 6 is a cross section of a VGA according to a second embodiment of the invention at a stage in processing.

Shown in FIG. 6 is a semiconductor device that is a portion of a virtual ground memory array (VGA) 50 comprising a substrate 52, a charge storage layer 54 over substrate 52, patterned sacrificial portions 56 and 58 over storage layer 54, and a patterned photoresist layer 55 over sacrificial portions 56 and 58. Substrate 52 is preferably a bulk silicon substrate and is analogous to substrate 12 of FIGS. 1-5. Storage layer 54 is preferably comprised of a gate dielectric layer, a layer of nanocrystals over the gate dielectric, and an oxide layer over the nanocrystals and is similarly analogous to storage layer 14 of FIGS. 1-5. Sacrificial portions 56 are preferably nitride but could be a different material and are preferably between 1000 and 2000 Angstroms in thickness.

Figure 7:
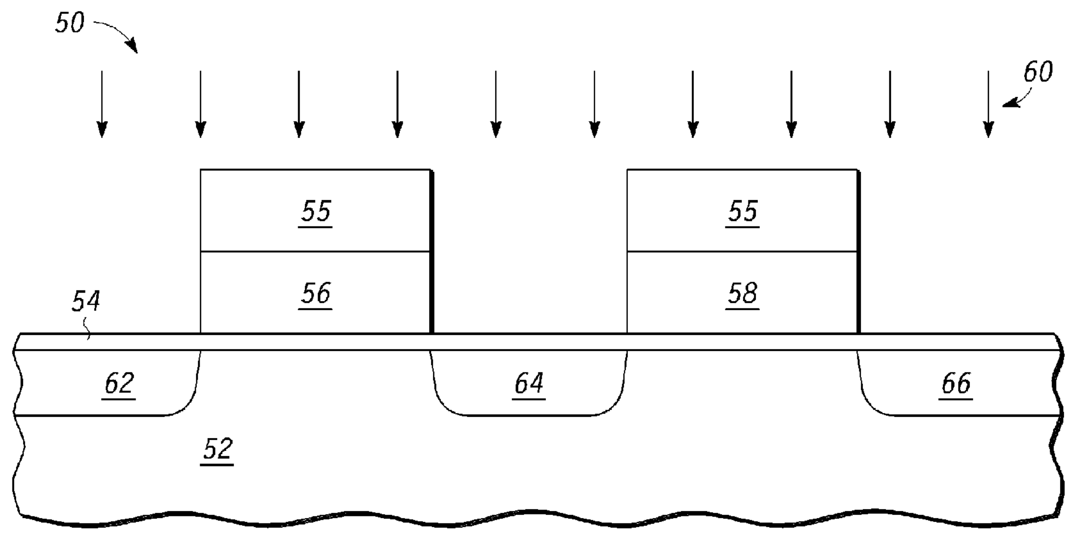
FIG. 7 is a cross section of the VGA of FIG. 6 at a subsequent stage in processing.

Shown in FIG. 7 is VGA 50 after performing an implanting step 60 to form source/drain regions 62, 64, and 66 in substrate 52 using patterned photoresist 55 and conductive portions 56 and 58 as a mask. Source/drain regions 62, 64, and 66 are doped regions preferably doped to N type to form N channel transistors and are analogous to source/drain regions 22, 24, and 26. An option is to remove storage layer 54 in the area over source/drain regions 62, 64, and 66. This would allow for storage layer 54 to use a floating gate as the charge storage element. If this option is chosen, it is preferable that it is done after the implanting.

Figure 8:
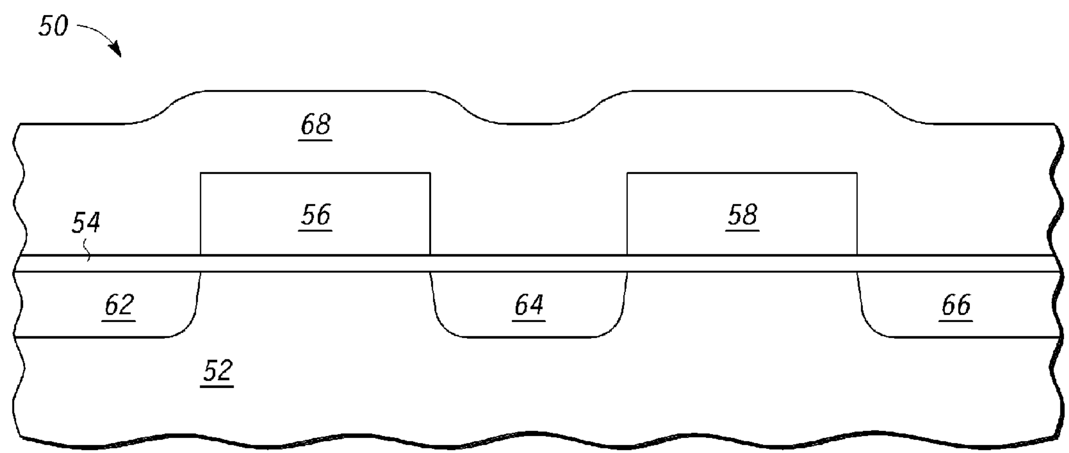
FIG. 8 is a cross section of a VGA of FIG. 7 at a subsequent stage in processing.

Shown in FIG. 8 is VGA 50 after removal of photoresist layer 55 and deposition of a somewhat conformal dielectric layer 68 that is sufficiently thick, preferably 1000 to 2000 Angstroms, that it rises to at least near the height of sacrificial portions 56 and 58. Dielectric layer 68 is preferably oxide, and more particularly oxide from TEOS, but could be a different material. Dielectric layer 68 preferably has a low dielectric constant and has a different etch characteristic than that of sacrificial portions 56 and 58 so that sacrificial portions 56 and 58 can be etched selective to dielectric layer 68. Thus, there would be benefit to having a lower k material than oxide if other processing restraints can be met and if it can be selectively etched to sacrificial portions 56 and 58. Sacrificial portions 56 and 58 can also be different than nitride in order to meet the requirements on dielectric layer 68.

Figure 9:
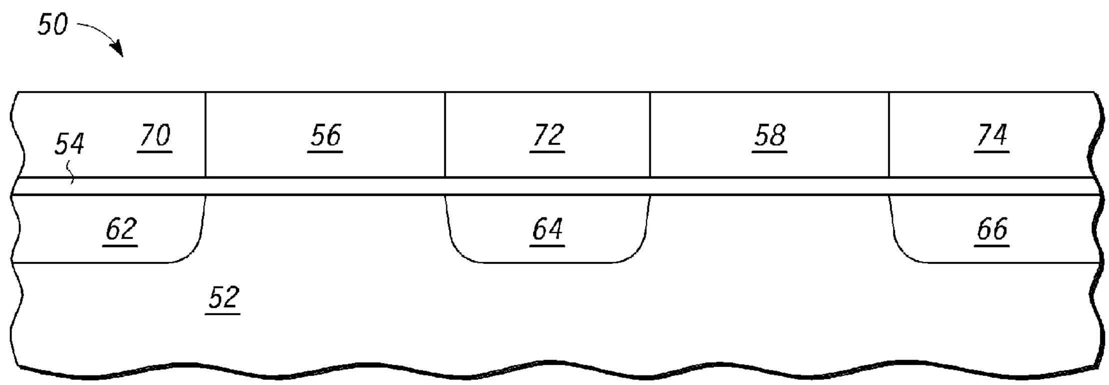
FIG. 9 is a cross section of the VGA of FIG. 8 at a subsequent stage in processing.

Shown in FIG. 9 is VGA 50 after a chemical mechanical polishing (CMP) step that is performed until sacrificial portions 56 and 58 are exposed. The result is a relatively flat surface in which dielectric layer 68 has been polished back to leave dielectric regions 70, 72, and 74 over source/drain regions 62, 64, and 66, respectively. The CMP step will reduce the thickness of sacrificial portions 56 and 58 somewhat to ensure they are exposed in all locations of VGA 50. Sacrificial portions 56 and 58 can be viewed as a polish stop because when the amount of oxide being removed becomes constant, then it is known that no more polishing is necessary.

Figure 10:
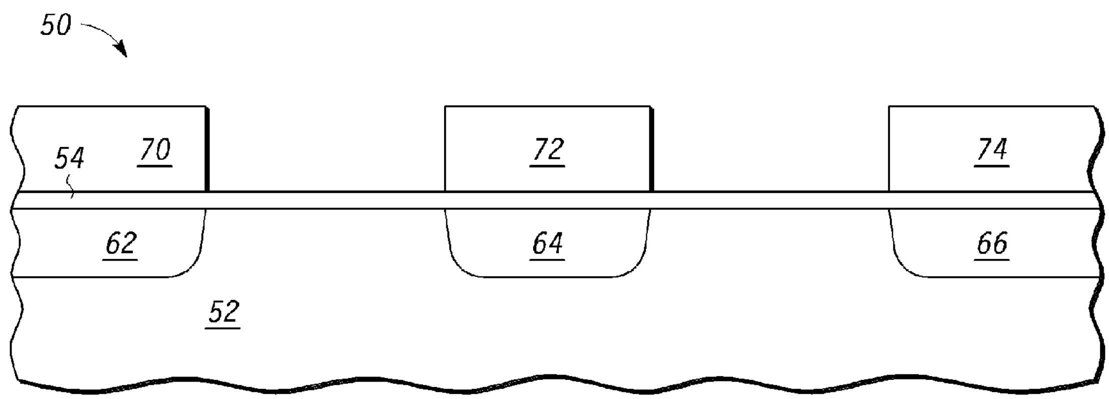
FIG. 10 is a cross section of the VGA of FIG. 9 at a subsequent stage in processing.

Shown in FIG. 10 is VGA 50 after etching sacrificial portions 56 and 58 using an etchant, preferably hot phosphoric acid, that etches nitride selective to oxide. Other etchants may be used instead that achieve this objective. This etch exposes the top surface of storage layer 54. The top portion of storage layer 54 will have a dielectric layer that can withstand exposure to the etchant without harming the charge storage characteristics of storage layer 54.

Figure 11:
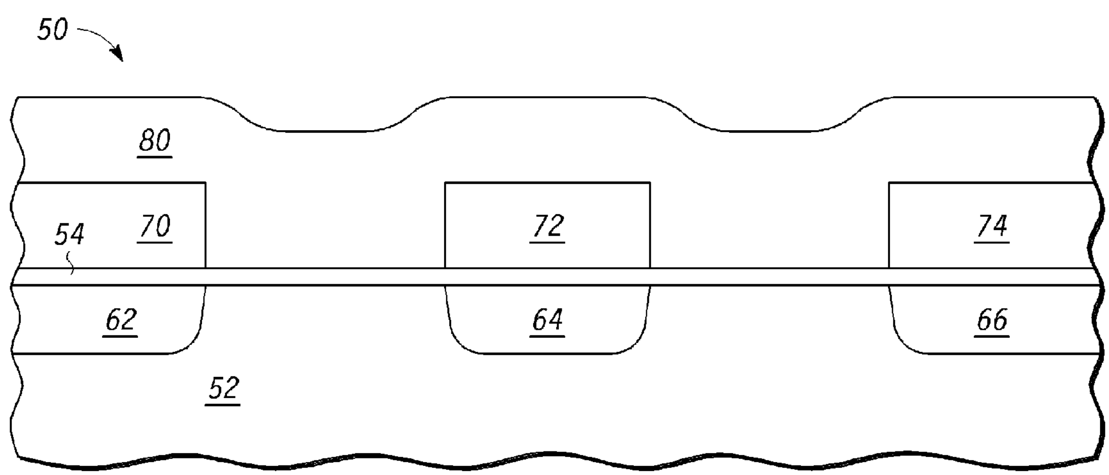
FIG. 11 is a cross section of the VGA of FIG. 10 at a subsequent stage in processing.

Shown in FIG. 11 is VGA 50 after formation of a word line 80. Word line 80 is preferably polysilicon but another suitable gate material could be used. Word line 80 functions as a gate for a memory transistor that has source/drains regions 62 and 64 as its source and drain and a memory transistor that has source/drain regions 64 and 66 as its source and drain. Word line 80 runs perpendicular to source/drain regions 62, 64, and 66 in their function as bit lines. The bottom of word line 80 has a uniform height above substrate 12 in the area, the channels of the memory transistors, between source/drain regions 62, 64, and 66, and word line 80 is spaced from source/drain regions 62, 64, and 66 by dielectric regions 70, 72, and 74, respectively. Thus, there is an effective reduction in the gate to drain capacitance of the memory transistors due to the dielectric spacers, which are effectively dielectric regions 70, 72, and 74 and storage layer 54, while having gate to channel uniformity. The dielectric spacers are substantially rectangular in cross section and they have substantially planar sidewalls and bottom surfaces. This can also be viewed as the dielectric spacers having a bottom surface that is substantially coplanar with the top surface of substrate 12 in the channel region. This method and structure should also be able to be used with similar effect as lithography and processing improvements reduce the geometries, such as channel lengths. Further, this is achieved while not requiring any extra masks than normally required for a VGA.

In both the embodiment of FIGS. 1-5 and the embodiment of FIGS. 6-11, the memory transistors can be either single bit cells or two bit cells.

In the foregoing specification, the invention has been described with reference to specific embodiments. However, one of ordinary skill in the art appreciates that various modifications and changes can be made without departing from the scope of the present invention as set forth in the claims below. For example, CMP was designated as the way to achieve a planar surface and expose sacrificial portions 56 and 58 and conductive portions 16 and 18, but another process may be able to achieve the desired intermediate result shown in FIG. 4. Similarly, the gate dielectric was described as grown oxide but could instead be a deposited high k dielectric. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device using a semiconductor substrate, comprising:

forming a charge storage layer over the semiconductor substrate having a top surface that is substantially planar;

implanting a doped region in the semiconductor substrate;

forming a first gate conductor over a first portion of the charge storage layer;

forming a second gate conductor over a second portion of the charge storage layer;

forming an insulating layer over the doped region and between the first gate conductor and the second gate conductor having a bottom surface that is substantially coplanar with the top surface of the charge storage layer; and forming a word line over the insulating layer and contacting the first gate conductor and the second gate conductor.

2. The method of claim 1, wherein forming the charge storage layer comprises:

forming a second insulating layer on the semiconductor substrate;

forming the charge storage layer on the second insulating layer; and forming a third insulating layer on the charge storage layer.

3. The method of claim 1, wherein implanting the doped region comprises:

forming a masking layer on the semiconductor substrate;

patterning the masking layer; and implanting the doped region.

4. The method of claim 3, wherein the masking layer is formed using nitride.

5. The method of claim 3, wherein the masking layer is formed using polysilicon.

6. The method of claim 3, wherein the patterned masking layer is the first gate conductor.

7. The method of claim 1, wherein the insulating layer is formed from TEOS.

8. The method of claim 1 further comprising removing the charge storage layer from above the doped region.

9. A method for forming a semiconductor device using a semiconductor substrate, comprising:

forming a charge storage layer over the semiconductor substrate having a top surface that is substantially planar;

implanting a doped region in the semiconductor substrate;

forming a patterned insulating layer over the charge storage layer having a bottom surface that is substantially coplanar with the top surface of the charge storage layer; and forming a gate conductor over the charge storage layer and adjacent to and over the patterned insulating layer.

10. The method of claim 9, wherein forming the charge storage layer comprises:

forming a second insulating layer on the semiconductor substrate;

forming the charge storage layer on the second insulating layer; and forming a third insulating layer on the charge storage layer.

11. The method of claim 9, wherein implanting the doped region comprises:

forming a masking layer on the semiconductor substrate;

patterning the masking layer; and implanting the doped region.

12. The method of claim 11, further comprising:

depositing TEOS over the patterned masking layer and the charge storage layer;

removing the TEOS over the patterned masking layer;

removing the patterned masking layer; and depositing a second gate conductor over the charge storage layer and the TEOS.

13. The method of claim 9, further comprising removing the charge storage layer from over the doped region.

* * * * *